(12) United States Patent
Michael et al.

(10) Patent No.: US 6,358,803 B1
(45) Date of Patent: Mar. 19, 2002

(54) METHOD OF FABRICATING A DEEP SOURCE/DRAIN

(75) Inventors: Mark Michael, Cedar Park; Jon D. Cheek, Round Rock, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/489,369

(22) Filed: Jan. 21, 2000

(51) Int. Cl.[7] .............................................. H01L 21/336
(52) U.S. Cl. ........................ 438/301; 438/303; 438/305
(58) Field of Search ................................ 438/230, 231, 438/232, 301, 303, 305, 306, 307, 592

(56) References Cited

U.S. PATENT DOCUMENTS

| | | | |
|---|---|---|---|
| 4,753,901 A | 6/1988 | Ellsworth et al. | 438/427 |
| 4,810,666 A | 3/1989 | Taji | 438/297 |
| 5,241,203 A | 8/1993 | Hsu et al. | 257/344 |
| 5,401,678 A | 3/1995 | Jeong et al. | 438/297 |
| 5,559,368 A | 9/1996 | Hu et al. | 257/369 |
| 5,734,192 A | 3/1998 | Sengle et al. | 257/506 |
| 5,777,370 A | 7/1998 | Omid-Zohoor et al. | 257/374 |
| 5,831,305 A | 11/1998 | Kim | 257/338 |
| 5,956,584 A * | 9/1999 | Wu | 438/232 |
| 5,998,274 A * | 12/1999 | Akram et al. | 438/306 |
| 6,018,180 A | 1/2000 | Cheek et al. | 257/344 |
| 6,093,628 A * | 7/2000 | Lim et al. | 438/592 |
| 6,107,130 A * | 8/2000 | Fulford, Jr. et al. | 438/231 |
| 6,140,168 A * | 8/2000 | Tan et al. | 438/197 |

OTHER PUBLICATIONS

Stanley Wolf and Richard N. Tauber, *Silicon Processing for the VLSI Era, vol. 1—Process Technology*; pp. 210–226, 555–565; 1986.

Stanley Wolf and Richard N. Tauber,*Silicon Processing for the VLSI Era, Vol. 2—Process Integration*; pp. 162–169; 318, 332–333, 354–361, 419–439; 1990.

Stanley Wolf and Richard N. Tauber,*Silicon Processing for the VLSI Era, vol. 3—The Submicron MOSFET*; pp. 367–407, 591–660; 1995.

* cited by examiner

*Primary Examiner*—Olik Chaudhuri
*Assistant Examiner*—Hoai Pham
(74) *Attorney, Agent, or Firm*—Timothy M. Honeycutt

(57) ABSTRACT

Methods of fabricating source/drain regions and transistors incorporating the same are provided. In one aspect, a method of fabricating a source/drain region in a substrate is provided that includes forming a stack on the substrate with a gate electrode and an insulating layer positioned on the gate electrode that has etch selectivity to the gate electrode. A first doped region is formed in the substrate adjacent to the stack with a first horizontal junction. A second doped region is formed in the substrate that overlaps the first doped region and has a second horizontal junction positioned beneath the first horizontal junction. An implant of impurity ions into the substrate is performed to establish a third doped region that overlaps the second doped region and has a third horizontal junction positioned beneath the second horizontal junction. The insulating layer prevents impurity ions from substantially penetrating through the gate electrode. The substrate is heated to activate the first, the second and the third doped regions. A deep junctioned source/drain region is established without substantial impurity penetration into the gate electrode, resulting in improved junction capacitance.

11 Claims, 3 Drawing Sheets

METHOD OF FABRICATING A DEEP SOURCE/DRAIN

BACKGROUND OF THE INVENTION

1. Field of the Invention

This invention relates generally to semiconductor fabrication, and more particularly to integrated circuits incorporating transistors with deep source/drain junctions, and to methods of fabricating the same.

2. Description of the Related Art

One variant of a basic conventional metal oxide semiconductor ("MOS") transistor consists of a gate electrode stack fabricated on a lightly doped semiconductor substrate. The gate stack consists of a gate dielectric layer and a gate electrode. A source region and a drain region are formed in the substrate beneath the gate dielectric layer and separated laterally to define a channel region. The gate electrode is designed to generate an electric field into the channel region. Changes in the electric field generated by the gate electrode enable, or alternatively, disable the flow of current between the source and the drain. In many processes, the source/drain regions consist of a lightly doped drain ("LDD") and an overlapping heavier doped region. The source/drain regions are electrically isolated laterally from adjacent conducting structures by isolation structures such as insulating trenches or field oxide regions.

Modern integrated circuits frequently incorporate millions of individual transistors. Most of the interconnections for the individual transistors are provided via one or more metallization layers that serve as global interconnect levels. Each metallization layer is ordinarily deposited on the substrate of the integrated circuit as a single continuous layer that is thereafter patterned lithographically and etched to remove metal from areas where metal lines are not required. In addition to the one or more metallization layers, modern integrated circuits also incorporate numerous routing-restricted interconnect levels commonly known as local interconnect ("LI"). LI's are used for short metallization runs such as those that locally interconnect gates and drains in NMOS and CMOS circuits and those that connect a given metallization layer to a particular structure in the integrated circuit. The resistivity of direct metal-to-silicon contacts is frequently less than optimal for desired device performance. To improve the resistivity of these silicon-based structures, a metal silicide layer is frequently formed on the substrate overlying the source/drain regions. If the gate electrode is silicon based, the silicide is formed there as well.

Switching speed is a primary indicator of MOS device performance. The switching speed of MOS transistors is affected by a variety of mechanisms, such as the channel transit time, i.e., the time required for a charge to be transported across the channel. However, the predominant mechanism affecting device speed is the time required to charge and discharge the various capacitances that exist between device electrodes and between interconnecting lines and the substrate. At the circuit level, the propagation delays are frequently limited by the interconnection-line capacitances and resistances. At the device level, however, the gate delay is determined primarily by the channel transconductance, the MOS gate capacitance and the parasitic or junction capacitances between the source/drain regions and the body, that is, the substrate or the well in circuits utilizing doped wells. Reductions in any or all of these capacitance values can result in increases in the device switching speed.

The gate capacitance of a MOS transistor may be reduced by decreasing the gate area, although this decrease is offset somewhat by a corresponding necessary reduction in the thickness of the gate dielectric layer. However, a dominant parasitic capacitance affecting the switching speed of a typical MOS transistor is the junction capacitance. Tailoring junction capacitance involves a careful balancing of competing design considerations. As a general rule, lower doping levels in the substrate or body translate into lower junction capacitances. Indeed, obtaining maximum circuit performance from a MOS device involves maximizing the drive current and minimizing junction capacitances and body effect, all of which favor lower doping concentrations in the device body. However, competing design considerations, such as optimizing packing density, favors raising the same doping concentrations to avoid punch-through and to achieve high field thresholds.

One disadvantage associated with conventional MOS transistor fabrication is the potential for the fabrication of abrupt pn junctions. The source/drain regions of a MOS device are normally heavily doped to minimize their resistivities. In processes utilizing ion implantation, this heavy doping concentration is normally achieved by performing a relatively high dosage, low energy implant. In a p-channel device, this type of implant produces a relatively steep tail-off in the p+ doping concentration at the pn junction. This rather steep dopant gradient results in a relatively high junction capacitance, particularly in view of the much lighter doping level at the n+ or n-well side of the pn junction.

One conventional technique for attempting to reduce the doping gradient in the vicinity of the pn junction involves performing an additional source/drain implant to a much greater depth than the LDD and heavier doped region source/drain implants. The difficulty associated with this method is the fact that the high energy necessary to achieve a sufficient depth for the implant gives rise to a correspondingly high potential for impurity ions to bore through the gate electrode, particularly polysilicon gate electrodes, and either corrupt the doping of the gate itself, or the underlying gate oxide and/or channel regions. This outcome is a consequence of the fact that the third and deep implant is performed following gate definition.

Another disadvantage associated with conventional transistor fabrication is the potential for high leakage currents or junction shorts at the vertical interfaces between source/drain regions and adjacent isolation structures. Trench isolation structures are fabricated by etching a trench or moat in the substrate and refilling the trench with one or more insulating materials. The fill is then planarized to the substrate surface. Exact planarity is seldom achieved. Indeed, portions of the substrate may protrude above the isolation structure. Depending on the height of the protrusions, the later-formed silicide layer may wrap around the protrusion and form a conducting pathway to the underlying well. The result may be high leakage currents or even direct junction shorting.

A conventional method for treating the problem of poor planarity is the aforementioned performance of a supplementary deep source/drain implant. However, as noted above, this technique performed in the conventional manner is not without drawbacks.

The present invention is directed to overcoming or reducing the effects of one or more of the foregoing disadvantages.

SUMMARY OF THE INVENTION

In accordance with one aspect of the present invention, a method of fabricating a source/drain region in a substrate is provided that includes forming a stack on the substrate with a gate electrode and an insulating layer positioned on the gate electrode that has etch selectivity to the gate electrode. A first doped region is formed in the substrate adjacent to the stack with a first horizontal junction. A second doped region is formed in the substrate that overlaps the first doped region and has a second horizontal junction positioned beneath the first horizontal junction. An implant of impurity ions into the substrate is performed to establish a third doped region that overlaps the second doped region and has a third horizontal junction positioned beneath the second horizontal junction. The insulating layer substantially prevents impurity ions from penetrating through the gate electrode. The substrate is heated to activate the first, the second and the third doped regions.

In accordance with another aspect of the present invention, a method of fabricating a source/drain region in a substrate is provided that includes forming a stack on the substrate that has a gate electrode and an insulating layer of silicon nitride or silicon oxynitride positioned on the gate electrode. A first doped region is formed in the substrate adjacent to the stack and with a first horizontal junction. A second doped region is formed in the substrate that overlaps the first doped region and has a second horizontal junction positioned beneath the first horizontal junction. An implant of impurity ions into the substrate is performed to establish a third doped region that overlaps the second doped region and has a third horizontal junction positioned beneath the second horizontal junction. The insulating layer substantially prevents impurity ions from penetrating through the gate electrode. The substrate is heated to activate the first, the second and the third doped regions.

In accordance with another aspect of the present invention, a method of fabricating a source/drain region in a substrate is provided that includes forming a stack on the substrate that has a gate electrode and an insulating layer positioned on the gate electrode that has etch selectivity to the gate electrode. A first source/drain region is formed in the substrate with a first horizontal junction and a second source/drain region is formed in the substrate with a second horizontal junction. An implant of impurity ions into the substrate is performed to establish a third doped region overlapping the first source/drain region with a third horizontal junction positioned beneath the first horizontal junction, and a fourth doped region overlapping the second source/drain region with a fourth horizontal junction positioned beneath the second horizontal junction. The insulating layer substantially prevents impurity ions from penetrating through the gate electrode. The substrate is heated to activate the first and second source/drain regions and the third and fourth doped regions.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
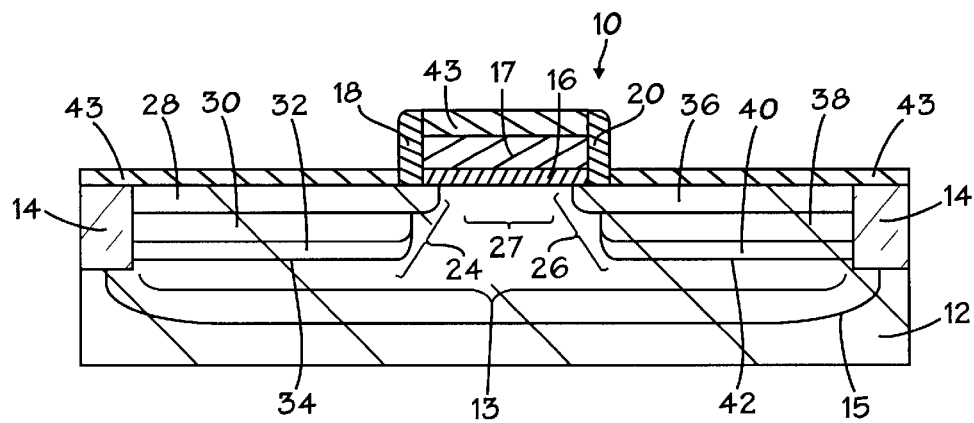
FIG. 1 is a sectional view of an exemplary embodiment of a transistor fabricated on a semiconductor substrate in accordance with the present invention.

In the drawings described below, reference numerals are generally repeated where identical elements appear in more than one figure. Turning now to the drawings, and in particular to FIG. 1, there is shown a cross-sectional view of an exemplary embodiment of a transistor 10 formed on a semiconductor substrate 12. As used herein, the terms "formed on", "disposed on" or "positioned on" should be construed to include the possibility that a given layer or structure may be formed on another given layer or structure with a third or other intervening layers or structures disposed between the two. The substrate 10 may be composed of p-type silicon, n-type silicon, silicon-on-insulator or other suitable semiconductor substrate materials. The substrate 12 is much larger than the small portion depicted and there may be plural transistors 10 fabricated thereon to make up an integrated circuit. The transistor 12 is fabricated on an active area 13 of the substrate 12 that is circumscribed and defined by an isolation structure, two portions of which are visible in FIG. 1 and designated 14. The portions 14 are the visible portions of an overall moat-like structure that surrounds the active area 13. The transistor 10 will be described herein as a p-channel field effect transistor. Accordingly, junction isolation in the substrate 12 is provided by an n-well 15 formed in the active area 13. However, it should be understood that the transistor 10 may be implemented alternatively as an n-channel device within a p-well.

The transistor 10 includes a gate insulating layer 16 positioned on the substrate 12 and a gate electrode 17 that is formed on the gate insulating layer 16. The gate insulating layer 16 and gate electrode 17 are bracketed by a pair of dielectric sidewall spacers 18 and 20. Source/drain regions 24 and 26 are provided in the substrate 12 and laterally separated in the active area 13 to define a channel region 27. The phrase "source/drain region(s)" is used herein to describe a region that may serve as either a source or a drain. The skilled artisan will appreciate that a source/drain region may function as a source or a drain depending upon how it is interconnected with subsequent metallization. The source/drain region 24 consists of a lightly doped drain 28 and overlapping heavier doped regions 30 and 32. The overlapping doped region 32 is fabricated so that its horizontal junction 34 is located at a relatively deep position in the substrate 12. In this way, the potential for undesirable shorts between the metal silicate layer 22 and the substrate 12 at the vertical interfaces between the substrate 12 and the isolation structures is substantially reduced. The source/drain region 26 is similarly provided with an LDD structure 36 and overlapping heavier doped regions 38 and 40. Like the overlapping doped region 32, the overlapping doped region 40 has its horizontal junction 42 positioned at a relatively deep position in the substrate 12.

The gate electrode 17 is capped with a metal silicide layer 43 composed of titanium silicide, cobalt silicide or the like. The metal silicide layer 43 also overlies the portions of the substrate 12 adjacent to the spacers 18 and 20.

Figure 2:
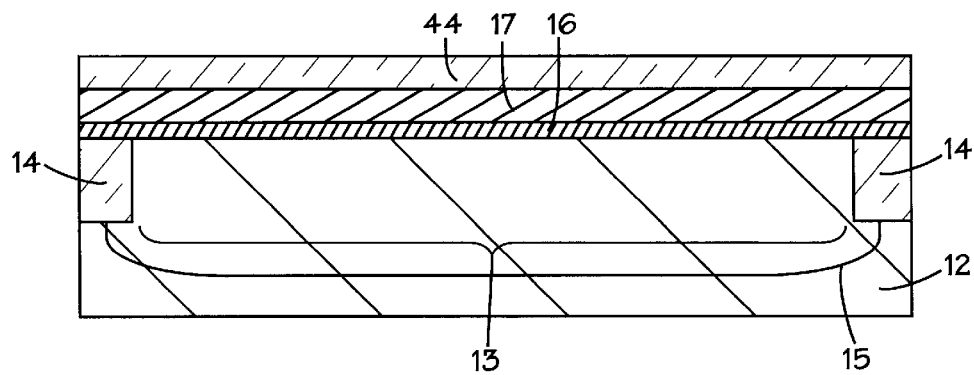
FIG. 2 is a sectional view of a substrate and depicts formation of a gate stack and an overlying insulating hard mask layer in accordance with the present invention.

An exemplary method of fabricating the transistor 10 in accordance with the present invention may be understood by referring now to FIGS. 2, 3, 4, 5, 6, 7 and 8, and initially to FIG. 2. The process will be described in the context of a p-channel device. However, the skilled artisan will appreciate that the process may be applied to an n-channel device if desired by using impurities of a different conductivity type. Initially, the isolation structure 14 is fabricated in the substrate 12. The isolation structure 14 may be a shallow trench isolation structure, a field oxide region or other suitable electrical isolation structures. In an exemplary embodiment, the isolation structure 14 is a shallow trench isolation structure composed principally of tetra-ethyl-ortho-silicate ("TEOS"). The n-well 15 is established in the substrate 12 by implanting an n-type dopant, such as arsenic or phosphorus and performing a subsequent high temperature drive anneal at about 900 to 1100° C. for about 10 to 30 minutes in a furnace process.

The gate insulating layer 16 is next formed on the substrate 12. The gate insulating layer 16 may be composed of a variety of insulating materials suitable for gate insulating layers, such as, for example, oxide, silicon nitride, or the like. In an exemplary embodiment, the gate insulating layer 16 is fabricated to a thickness of about 15 to 80 Å by dry oxidation of the substrate 12 in an oxygen containing ambient at about 800 to 1050° C. in a furnace process. Optionally, a rapid thermal anneal process may be used.

The gate electrode 17 is subsequently fabricated by blanket deposition of a conducting material, such as, for example, polysilicon, amorphous silicon, tungsten, or the like. In an exemplary embodiment, polysilicon is blanket deposited to a thickness of about 700 to 1500 Å using well known chemical vapor deposition techniques. Through subsequent masking and etching, the layers 16 and 17 will be patterned to define the shapes generally depicted in FIG. 1.

Following the deposition of the gate electrode layer 17, an insulating layer 44 is formed on the gate electrode layer 17. As described more fully below, the insulating layer 44 will serve as a temporary hard mask against a later impurity implant that is performed to establish the lowermost doped regions 32 and 40 shown in FIG. 1 and will be subsequently etched away following the implant. Accordingly, it is desirable for the insulating layer 44 to be composed of a material or materials that exhibit good etch selectivity to the underlying gate electrode 17 and that is capable of withstanding the high temperatures associated with the activation anneals for the source/drain regions 24 and 26 shown in FIG. 1. Exemplary materials include, for example, silicon nitride and silicon oxynitride. In an exemplary embodiment, silicon nitride is blanket deposited to a thickness of about 700 to 1500 Å using well known low pressure CVD ("LPCVD") or plasma enhanced CVD ("PECVD") techniques. Note that if silicon oxynitride is selected as the material, well known PECVD or conventional CVD techniques may be used.

Figure 3:
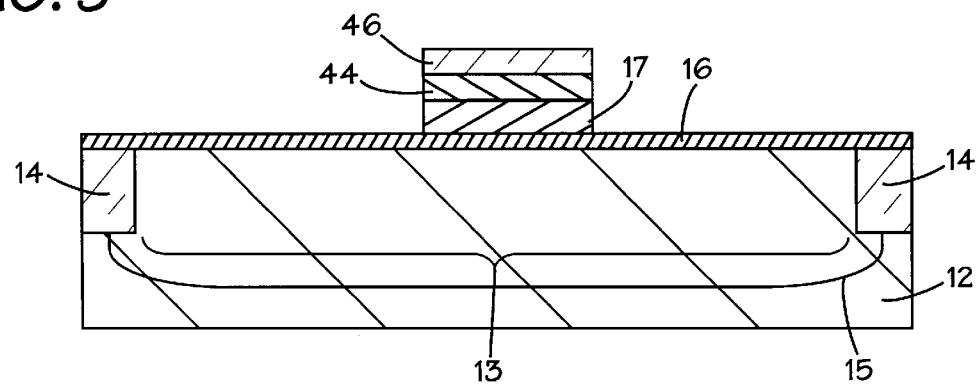
FIG. 3 is a sectional view like FIG. 2 depicting patterning of the hard mask and gate electrode layers in accordance with the present invention.

Referring now to FIG. 3, the insulating layer 44 is appropriately masked with photoresist 46 that is patterned, that is, exposed and developed into the desired shape for the gate electrode 17, and the insulating layer 44 and the gate electrode 17 are patterned by anisotropic etching. A variety of etch chemistries may be employed. In an exemplary embodiment, a $CF_4/O_2$ plasma may be used to etch both the insulating layer 44 and the underlying polysilicon layer 17, with the polysilicon 17 etching at a higher rate. The etch of the polysilicon 17 is performed with some selectivity to the underlying oxide 16 and attention paid to endpoint detection so that the portions of the layer 16 lateral to the defined gate 16 will serve as a screen oxide against a subsequent implant.

Figure 4:
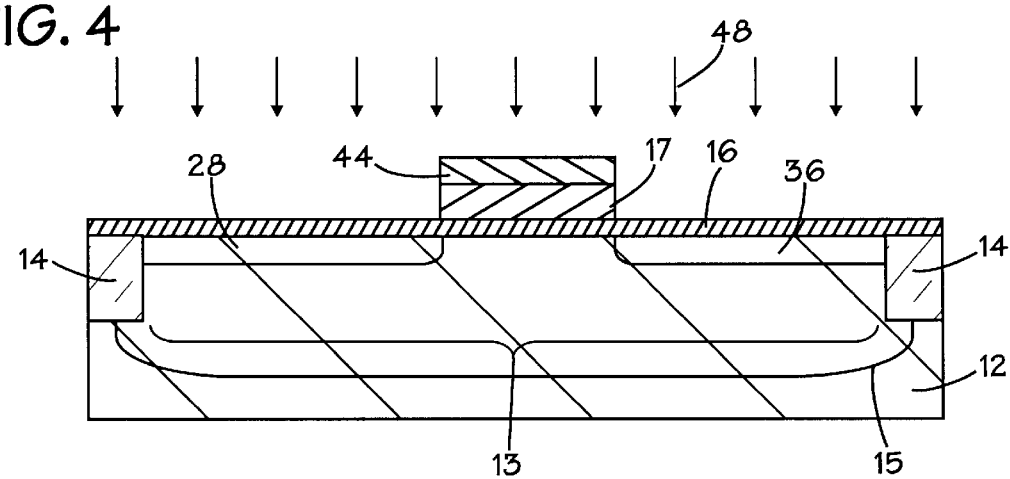
FIG. 4 is a sectional view like FIG. 3 depicting the formation of LDD structures in accordance with the present invention.

The fabrication of the LDD structures 28 and 36 may be understood by referring now to FIG. 4. The resist 46 depicted in FIG. 3 is stripped by ashing, solvent removal or the like and an implant of impurity ions 48 is performed to establish the LDD structures 28 and 36. The exposed portions of the insulating layer 16 act as a screen oxide against the implant, enabling the LDD structures 28 and 36 to be established with relatively shallow junctions. The insulating layer 44 acts as a hard mask against the implant to aid in preventing the addition of p-type doping in the otherwise n+ channel 27. In an exemplary embodiment for a p-channel device, $BF_2$ is implanted with a dosage of about 1E13 to 5E14 $cm^{-2}$ and an energy of about 8 to 12 keV.

Figure 5:
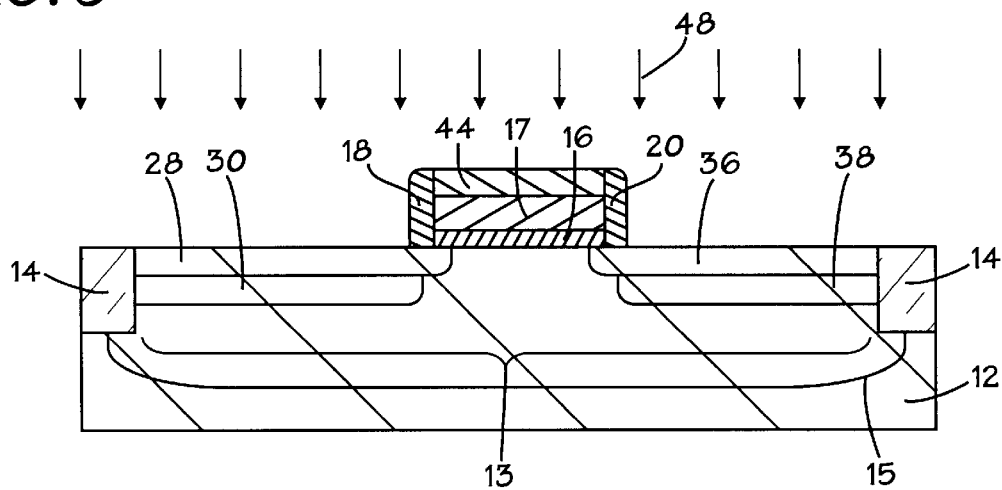
FIG. 5 is a sectional view like FIG.4 depicting formation of spacers and overlapping heavier doped source/drain regions in accordance with the present invention.

The establishment of the overlapping doped regions 30 and 38 may be understood by referring now to FIG. 5. Initially, the portions of the gate insulating layer 16 functioning as a screen oxide in FIG. 4 are stripped using well known oxide stripping techniques. The spacers 18 and 20 are next established by blanket deposition of a dielectric material such as oxide or silicon nitride, followed by an anisotropic etch selective to the underlying substrate 12. If desired, a second screen oxide layer (not shown) may be formed on the substrate 12 prior to the fabrication of the spacers 18 and 20 to protect the underlying LDD structures 28 and 36. The spacers 18 and 20 may be about 200 to 600 Å thick. Following formation of the spacers 18 and 20, a second implant of impurity ions 48 is performed to establish the overlapping doped regions 30 and 38. For a p-channel device, a p-type impurity, such as $BF_2$, may be implanted with a dosage of about 1E15 to 5E15 $cm^{-2}$ and an energy of about 18 to 22 keV.

Figure 6:
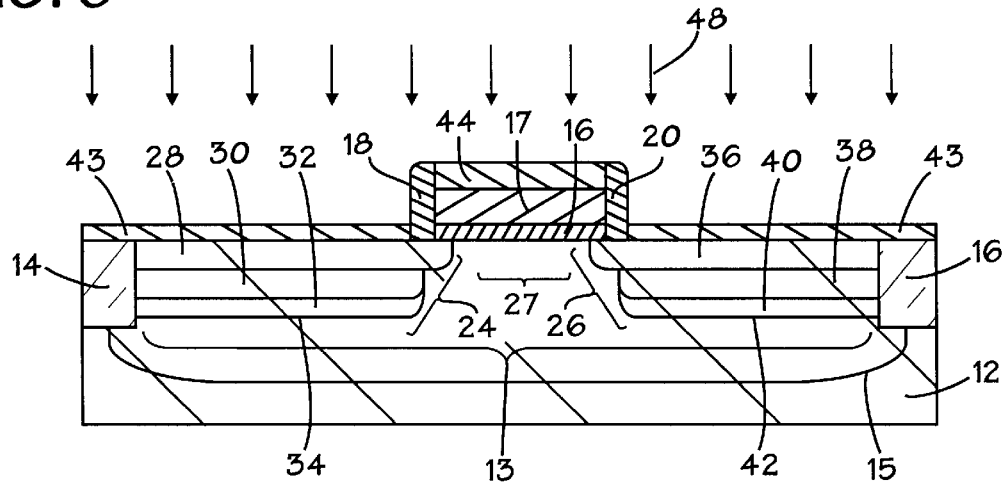
FIG. 6 is a sectional view like FIG. 5 depicting the formation of deep overlapping doped regions in the substrate in accordance with the present invention.

The formation of the lower most doped regions 32 and 40 may be understood by referring now to FIG. 6. A third implant of impurity ions 48 is performed with a much higher energy level than the earlier source/drain implants to establish the overlapping doped regions 32 and 40 with their respective horizontal junctions 34 and 42 located at the relatively deep positions shown. In an exemplary embodiment for a p-channel device, $BF_2$ may be implanted with a dosage of about 5E13 to 5E14 $cm^{-2}$ and an energy of about 50 to 80 keV. In conventional processing, the implantation of the ions 48 at such high energy levels can penetrate the polysilicon gate electrode 17 and adversely affect the impurity levels in the channel region 27. However, the insulating layer 44 acts as a hard mask against the implant, to prevent the impurity ions from substantially penetrating through the gate electrode 17. It is intended that a large majority of the ions impacting the insulating layer 44 will not penetrate through the gate 17. However, a small minority of the ions 48 may penetrate through the gate 17 due the unpredictable nature of interatomic collisions within the lattices of the layer 44, the gate 17 and the gate insulating layer 16.

Figure 7:
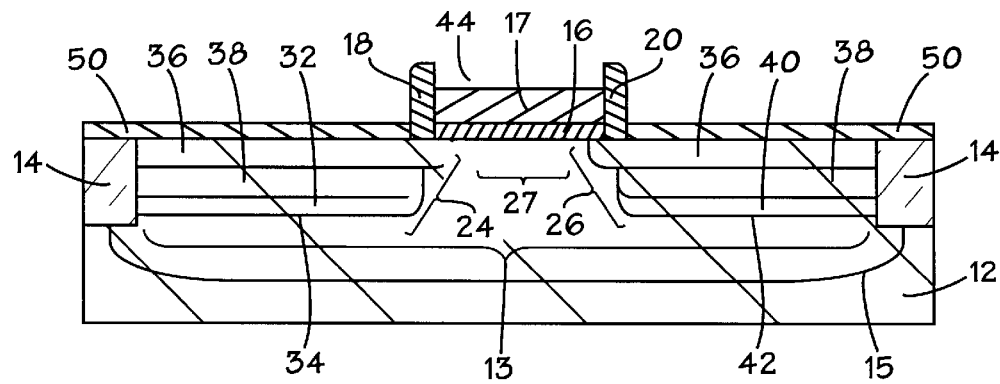
FIG. 7 is a sectional view like FIG. 6 depicting removal of the hard mask layer in accordance with the present invention.

Referring now to FIG. 7, the substrate 12 is next subjected to an anneal to activate the source/drain regions 24 and 26 and to alleviate crystal and damage resulting from the implants. The anneal may be carried out at about 900 to 1050° C. for about 10 to 30 seconds in a rapid thermal anneal process. Note that if n-type impurities are implanted, the anneal should be carried out at a slightly higher temperature to account for the lower migration rates for typical n-type impurities, such as arsenic. Note further that the anneal will result in some lateral movement of the source/drain regions 24 and 26 and produce an overlap between the source/drain regions 24 and 26 and the overlying gate electrode 17.

Still referring to FIG. 7, the insulating layer 44 depicted in FIG. 6 is removed by isotropic etching using well known hot phosphoric acid dip techniques. If desired, a pad oxide layer 50 may be formed by thermal oxidation or CVD on the exposed portions of the substrate 12 to protect the underlying LDD regions 28 and 26 from the dip.

Figure 8:
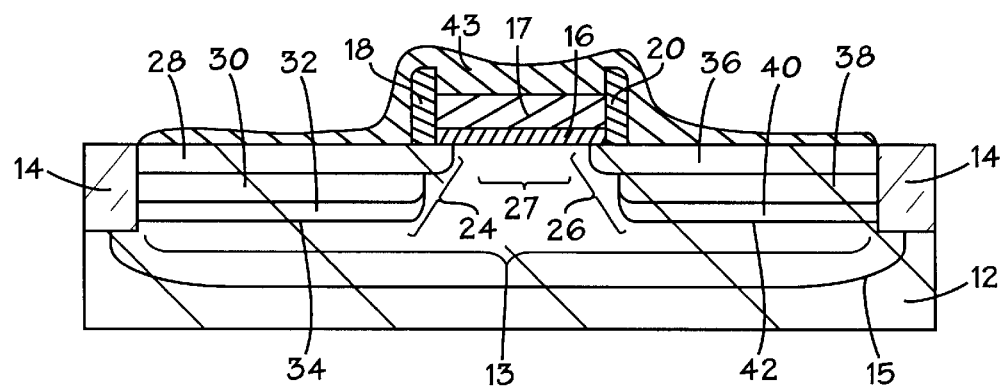
FIG. 8 is a sectional view like FIG. 7 depicting the formation of a metal silicide layer on the substrate in accordance with the present invention.

The fabrication of the silicide layer 43 may be understood by referring now to FIG. 8. A silicide forming material, such as, for example, titanium or cobalt, is blanket deposited on the substrate 12, the substrate 12 is then heated to initiate a silicide forming reaction between the metal and the underlying substrate 12 and the polysilicon gate electrode 16. A second anneal is performed to stabilize the silicide 43. The unreacted portions of the metal material are then stripped using well known techniques to leave the defined silicide layer 43 as shown in FIG. 1.

Figure 9:
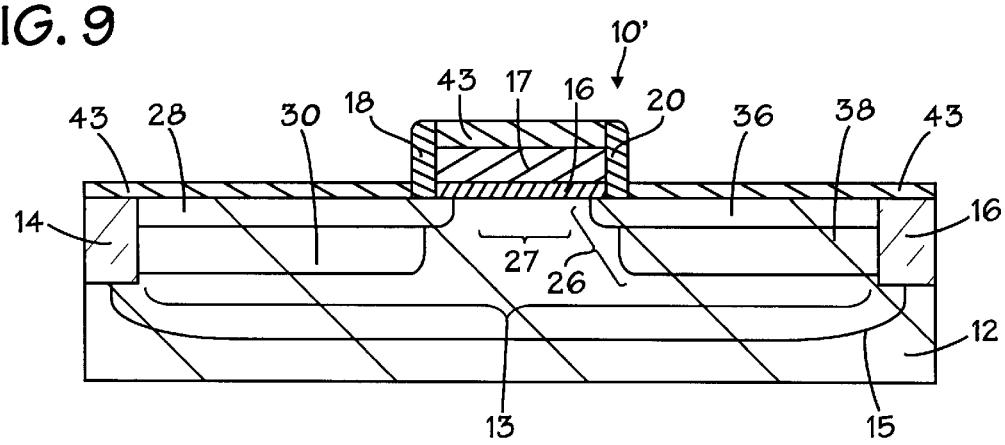
FIG. 9, like FIG. 5, shows source/drain regions according with the present invention.

An alternate exemplary embodiment of an integrated circuit transistor, now designated 10', may be understood by referring now to FIG. 9. In this embodiment, the transistor 10' may be substantially identical to the transistor 10 depicted in FIG. 1 with a notable exception. In this illustrative embodiment, the above described lower most doped regions 32 and 40 are eliminated and their function replaced by the overlapping doped regions 30 and 38. The energy and dosage of the implant to establish the overlapping doped regions 30 and 38 is selected to achieve relatively deep horizontal junctions that serve the aforementioned purpose of reducing the possibility of junction shorting. The fabrication of the transistor 10' may be performed substantially as described above and depicted in FIGS. 2, 3, 4 and 5. However, the implant to establish the overlapping doped regions 30 and 38 may be performed at about 5E14 to 5E15 $cm^{-2}$ and about 15 to 50 keV for $BF_2$. As in the aforementioned illustrative embodiment, the insulating layer 44 serves as a hard mask against the implant to reduce the possibility of impurity penetration of the polysilicon gate electrode 17. Following the implant to establish the overlapped regions 30 and 38, the fabrication may proceed generally as described above and shown in FIGS. 7 and 8, albeit without the incorporation of the third doped region for each of the source/drain regions 24 and 26.

The foregoing illustrative embodiments provide a field effect transistor with improved, that is, reduced junction capacitance and potentially higher switching speeds. The improved junction capacitance is made possible by the establishment of a deep source/drain doped region with low risk of impurity penetration into the gate electrode which might otherwise adversely affect the doping of the channel.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a source/drain region in a substrate, comprising:

forming a stack on the substrate having a gate electrode and an insulating layer positioned on the gate electrode, the insulating layer having an etch selectivity to the gate electrode;

forming a first doped region in the substrate adjacent to the stack and with a first horizontal junction;

forming a second doped region in the substrate overlapping the first doped region with a second horizontal junction positioned beneath the first horizontal junction;

performing an implant of impurity ions into the substrate to establish a third doped region overlapping the second doped region and with a third horizontal junction positioned beneath the second horizontal junction, the insulating layer substantially preventing impurity ions from penetrating through the gate electrode;

removing the insulating layer by etching selectively to the gate electrode after performing the implant of impurity ions to establish the third doped region; and heating the substrate to activate the first, the second and the third doped regions.

2. The method of claim 1, comprising forming first and second spacers adjacent to the stack after the first doped region is formed but before the second doped region is formed.

3. The method of claim 1, wherein the first and second doped regions are formed by implanting impurity ions into the substrate.

4. The method of claim 1, wherein the stack is formed by depositing a layer of polysilicon on the substrate and a layer of silicon nitride on the layer of polysilicon, and etching the layer of silicon nitride and the layer of polysilicon to define the stack.

5. The method of claim 1, wherein the insulating layer is formed by depositing silicon nitride or silicon oxynitride.

6. The method of claim 1, comprising forming a silicide layer on the gate electrode after removal of the insulating layer.

7. A method of fabricating a source/drain region in a substrate, comprising:

forming a stack on the substrate having a gate electrode and an insulating layer of silicon nitride or silicon oxynitride positioned on the gate electrode;

forming a first doped region in the substrate adjacent to the stack and with a first horizontal junction;

forming a second doped region in the substrate overlapping the first doped region with a second horizontal junction positioned beneath the first horizontal junction;

performing an implant of impurity ions into the substrate to establish a third doped region overlapping the second doped region and with a third horizontal junction positioned beneath the second horizontal junction, the insulating layer substantially preventing impurity ions from penetrating through the gate electrode;

removing the insulating layer by etching selectively to the gate electrode after performing the implant of impurity ions to establish the third doped region; and heating the substrate to activate the first, the second and the third doped regions.

8. The method of claim 7, comprising forming first and second spacers adjacent to the stack after the first doped region is formed but before the second doped region is formed.

9. The method of claim 7, wherein the first and second doped regions are formed by implanting impurity ions into the substrate.

10. The method of claim 7, wherein the stack is formed by depositing a layer of polysilicon on the substrate and a layer of silicon nitride on the layer of polysilicon, and etching the layer of silicon nitride and the layer of polysilicon to define the stack.

11. The method of claim 7, comprising forming a silicide layer on the gate electrode after removal of the insulating layer.

* * * * *